United States Patent
Hoogenraad et al.

(10) Patent No.: US 7,477,054 B2
(45) Date of Patent: Jan. 13, 2009

(54) MAGNETIC RESONANCE IMAGING AT SEVERAL RF FREQUENCIES

(75) Inventors: Frank Gerardus Cornelis Hoogenraad, Eindhoven (NL); Johan Samuel Van Den Brink, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 85 days.

(21) Appl. No.: 11/568,280

(22) PCT Filed: Apr. 22, 2005

(86) PCT No.: PCT/IB2005/051328

§ 371 (c)(1),
(2), (4) Date: Oct. 25, 2006

(87) PCT Pub. No.: WO2005/106518

PCT Pub. Date: Nov. 10, 2005

(65) Prior Publication Data

US 2007/0164738 A1 Jul. 19, 2007

(30) Foreign Application Priority Data

Apr. 29, 2004 (EP) .................................. 04252513
Sep. 24, 2004 (EP) .................................. 04104664

(51) Int. Cl.
*G01V 3/00* (2006.01)
(52) U.S. Cl. ..................................... 324/307; 324/318
(58) Field of Classification Search ......... 324/300–322; 600/407–422
See application file for complete search history.

(56) References Cited

U.S. PATENT DOCUMENTS

| 4,957,591 | A | | 9/1990 | Sato et al. |
| 5,675,254 | A | * | 10/1997 | Fiat et al. ..................... 324/318 |
| 5,715,822 | A | * | 2/1998 | Watkins et al. ............... 600/422 |
| 5,964,705 | A | * | 10/1999 | Truwit et al. ................. 600/423 |
| 6,033,645 | A | * | 3/2000 | Unger et al. .................. 424/9.5 |
| 6,236,205 | B1 | * | 5/2001 | Ludeke et al. ................ 324/318 |
| 6,574,497 | B1 | | 6/2003 | Pacetti |
| 6,975,896 | B2 | * | 12/2005 | Ehnholm et al. ............. 600/414 |
| 7,014,643 | B2 | * | 3/2006 | Engelhard et al. ........... 606/130 |

FOREIGN PATENT DOCUMENTS

| WO | WO0054309 A1 | 9/2000 |
| WO | WO02088766 A1 | 11/2002 |

* cited by examiner

*Primary Examiner*—Brij B Shrivastav

(57) ABSTRACT

A magnetic resonance imaging system comprises a receiver system to acquire magnetic resonance signals. A control system controls the receiver system to reform an acquisition sequence to acquire the magnetic resonance signals in several acquisition segments. Respective groups of acquisition segments involve acquisition of magnetic resonance signals in different RF-receiver frequency bands. In the respective groups of acquisition segments, magnetic resonance signals are acquired from different nuclei having different gyromagnetic ratios. According to the invention, reconstruction of different types of information carried by the respective nuclei is made possible. For example, imaging of the anatomy of a patient to be examined is performed on the basis of proton magnetic resonance imaging. Imaging of a targeted contrast agent is achieved on the basis of $^{19}F$ magnetic resonance imaging. Localisation of a invasive device, such as a catheter, is also performed on the basis of e.g. $^{19}F$ magnetic resonance imaging.

12 Claims, 2 Drawing Sheets

MAGNETIC RESONANCE IMAGING AT SEVERAL RF FREQUENCIES

Figure 1:
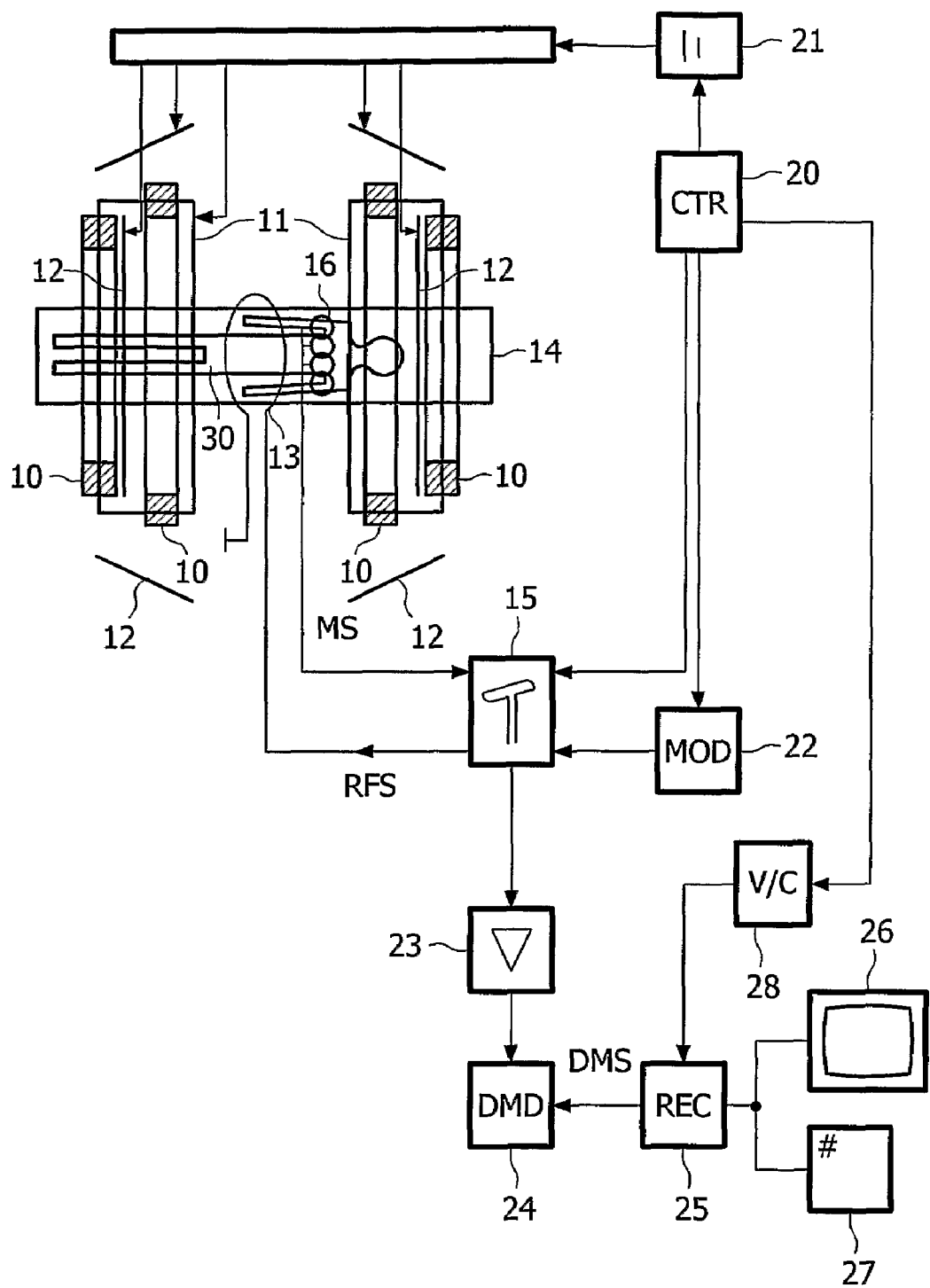

The invention pertains to a magnetic resonance imaging system which acquires magnetic resonance signals from different nuclei.

Such a magnetic resonance imaging system is known from the U.S. Pat. No. 6,574,497.

The known magnetic resonance imaging system operates according to a magnetic resonance imaging method in which compounds containing $^{19}F$ material are used as a contrast agent in interventional magnetic resonance angiography. The known method makes use of a reasonable sensitivity compared to protons of the nucleus $^{19}F$ at the RF-frequency range for protons. The lumen of the interventional device is filled with the $^{19}F$ contrast agent. The magnetic resonance image that is reconstructed from the magnetic resonance signals acquired at the conventional RF-frequency range displays the interventional device relative to the anatomy of the patient when the interventional device is introduced in the patient's body. Accordingly, the position of the interventional device is found from the magnetic resonance image, that is the interventional device is localised within the patient's body.

An object of the invention is to provide a magnetic resonance imaging system which relative to the known magnetic resonance imaging system, has a better capability of magnetic resonance imaging for more than a single nucleus. A further object of the invention is to provide an efficient acquisition of magnetic resonance signals for more than a single nucleus.

This object is achieved by a magnetic resonance imaging system according to the invention comprises
 a receiver system to acquire magnetic resonance signals
 a control system to control the receiver system to
  perform an acquisition sequence to acquire the magnetic resonance signals in several acquisition segments, respective groups of acquisition segments involve acquisition of magnetic resonance signals in different RF-receiver frequency bands.

In the respective groups of acquisition segments, magnetic resonance signals are acquired from different nuclei having different gyromagnetic ratios. The acquisition of magnetic resonance signals on a segmented basis for the different nuclei is quite efficient. The segmented approach allows separate optimisation and adjustment of the acquisition of magnetic resonance signals from the respective different types of nuclei. That is, from nuclei having different gyromagnetic ratios, this may involve different atomic numbers as well as different atomic masses. Notably, requirements that are applicable for one type of nucleus do not interfere with requirements for another type of nucleus in the segmented acquisition. Notably, the segments from different groups are acquired in an alternating or interleaved way. That is, between acquisitions of segments of one group in its proper RF-receiver frequency bands there are acquisitions of segments of an other group in its proper different RF-receiver frequency band. This approach is also termed a 'time-sliced acquisition'. From the magnetic resonance signals of the segments of one group information is reconstructed carried by the type of nuclei at issue. Thus, according to the invention, reconstruction of different types of information carried by the respective nuclei is made possible. For example, imaging of the anatomy of a patient to be examined is performed on the basis of proton magnetic resonance imaging. Imaging of a targeted contrast agent is achieved on the basis of $^{19}F$ magnetic resonance imaging. Localisation of a invasive device, such as a catheter, is also performed on the basis of e.g. $^{19}F$ magnetic resonance imaging. To that end, the catheter is provided with one or several reservoirs that are filled with a $^{19}F$ compound, or the $^{19}F$ compound is introduced in the lumen of the catheter or in an inflatable balloon that the distal end of the catheter.

Magnetic resonance imaging on the basis of nuclei other than protons is useful to acquire information on the metabolisms of the patient to be examined; notably magnetic resonance imaging at $^{31}P$ is used for direct imaging of metabolic processes.

A particular efficient acquisition of the magnetic resonance signals of segments from the several groups is achieved by simultaneous acquisition, i.e. at least partially overlapping in time, of the segments of different groups. This simultaneous acquisition operates successfully when the RF-receiver frequency bands of the different groups of segments are at least a minimum separation apart. Given the gyromagnetic ratio for nuclei envisaged for typical use, and main magnetic field strengths exceeding 0.2T, the frequency separation is never a practical issue, in that present day magnetic resonance imaging systems are well able to resolve the RF-receiver frequency bands of the different groups of segments related to respective nuclei. Notably, fast imaging sequences make use of read-out bandwidths in the range of 0.2 kHz to 1 MHz and a slice selection bandwidth of typically less than 10 kHz. Under these conditions the minimum separation of the RF receiver frequency bands for different types of nuclei (far) exceeds the MR signal bandwidths for a signal in one of the RF receiver frequency bands, even for a low-field (0.2T) (open) magnetic resonance imaging system. Further, any RF excitation in the RF frequency of a first nucleus is transparent for the other nucleus, as long as J-coupling between the two nuclei is negligible.

These and other aspects of the invention will be further elaborated with reference to the embodiments defined in the dependent Claims.

According to a further aspect of the invention, RF-excitations and readouts are applied from several excitation groups. RF-excitations and readouts from individual groups involve different RF frequency bands. In particular the RF-excitations and readouts from different groups are alternated or interleaved. Often, the alternation or interleaving of the RF-excitations and readouts from respective excitation groups are applied in correspondence with the alternation or interleaving of the acquisition segments. Especially when the RF frequency bands are at least a minimum separation apart, the RF-excitations and readouts from different groups may be applied simultaneously or at least partially overlapping in time. The alternation, interleaving or the simultaneous application of RF-excitations from different excitation groups at respective RF frequency bands, enhances the efficiency of the acquisition sequences. Particular good results are obtained when one or more of the acquisition segments involve respective RF-excitations at predetermined flip-angles so that a steady-state imaging acquisition is done. When the flip-angles of successive RF-excitations have alternating sign, then sensitivity for inhomogeneities of the magnetic field and for non-linearities of the magnetic gradient fields is reduced so that these inhomogeneities and non-linearities lead to only to a low level of perturbation in the magnetic resonance images. Good results are achieved in that adequate image quality is achieved for flip-angles in the range of 20°-60°. Within this range of flip-angles also the SAR can be kept within acceptable safety limits.

According to a further aspect of the invention, steps are taken to take into account that differences between the values of the gyromagnetic ratio of the respective nuclei lead to differences in the effect of temporary gradient field integrals on the wavevector of the magnetic resonance signals of the respective nuclei. Notably an important consequence is that, for a given MR excitation or sampling bandwidth, the field-of-view is inversely proportional to the gyromagnetic ratio of the nucleus at issue. One measure of the invention involves to perform a degree of oversampling of the magnetic resonance signals in the lower RF-receiver frequency band(s) and to account for this oversampling in the reconstruction of the magnetic resonance image. When more than one type of nucleus is involved, then the lower the RF-receiver frequency band, the larger the degree of oversampling is applied. This enables the use of one set of temporary magnetic gradient fields, gradient pulses, for spatially encoding the magnetic resonance signals from different types of nuclei. Advantageously, the magnetic resonance imaging system of the invention is provided with a correction module to set the field-of-view for the respective types of nuclei and to set the degree of oversampling for at least one of the types of nuclei in dependence of the set field-of-view.

According to a further aspect of the invention the RF-excitation and magnetic resonance signal acquisition are (partially) simultaneously carried out. Accordingly, RF-excitation in one RF-frequency band and acquisition of magnetic resonance signals that are caused e.g. as echoes, due to RF-excitation in a different RF-frequency band are done to some degree in parallel. This enhances the efficiency of the generation and acquisition of the magnetic resonance signals from various types of nuclei. Very good results are achieved when the respective RF-frequency bands are well separated. In particular, chemical, substances containing different types of nuclei can be selected in which single resonances at the individual types of nuclei occur, e.g. due to low or no J-coupling (homonuclear nor heteronuclear). For example, perfluorocarbons may be selected in which all $^{19}F$ nuclei are chemically equivalent, so that a single $^{19}F$-resonance is observed, and ghost images are avoided. These perfluorocarbons are quite suitable to be employed as marker compounds to localise interventional instruments, such as a catheter.

According to a next aspect of the invention, respective groups of magnetic resonance images are reconstructed from the magnetic resonance signals from the different groups of segments. That is, respective groups of magnetic resonance images are reconstructed from the magnetic resonance signals from the respective types of nuclei. Individual groups of magnetic resonance images pertain to image information that relate to the respective types of image. These respective types of information may be presented in various ways. For example, magnetic resonance images for different types of nuclei are displayed successively at a high frame rate. This creates an impression to the viewer of images that show information relating to different types of nuclei. In practice good results are obtained at frame rates of about 20 fps in total, i.e. in a time-sliced acquisition for two types of nuclei better than 10 fps per type of nucleus.

In another embodiment magnetic resonance images are reconstructed from magnetic resonance signals from respective segments, i.e. pertaining to respective types of nuclei. Subsequently, a merged magnetic resonance image is formed from (parts of) the magnetic resonance images that pertain to different types of nuclei. In the merged magnetic resonance image it appears convenient for viewing the information when information that originates from different RF-frequency bands, i.e. pertains to different types of nuclei is presented in different colours or in different image texture.

The invention also relates to a magnetic resonance imaging method and computer program that achieve efficient acquisition of magnetic resonance signals for more than a single nucleus. When the computer program installed in the computer included in a magnetic resonance imaging system, the magnetic resonance imaging system is enabled to operate according to the invention and achieve efficient acquisition of magnetic resonance signals for more than a single nucleus.

Figure 2:
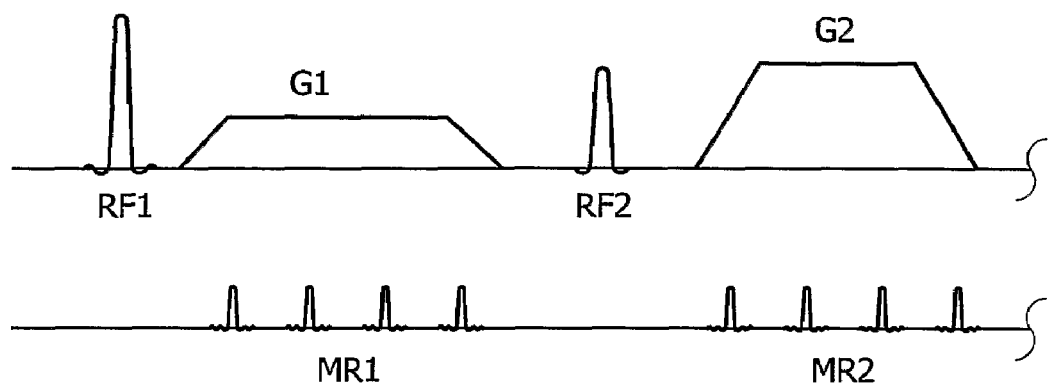
Figure 3:
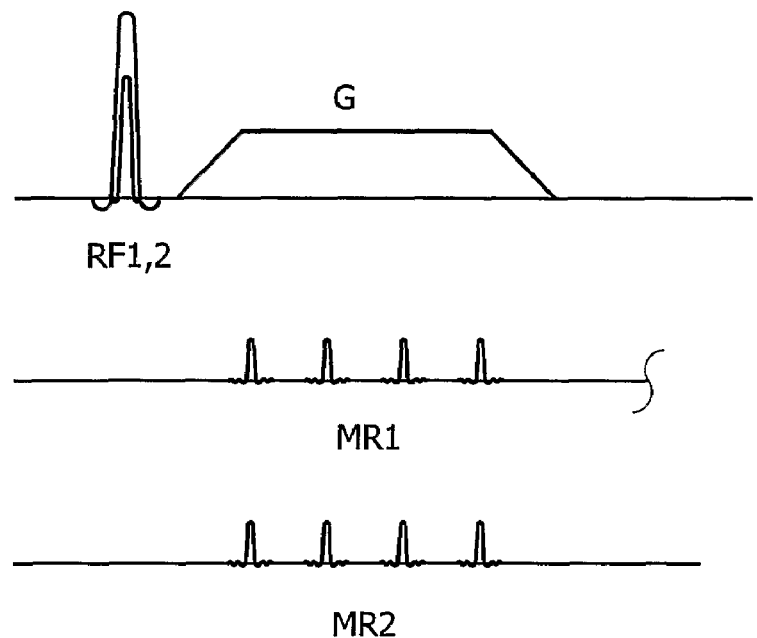

These and other aspects of the invention will be elucidated with reference to the embodiments described hereinafter and with reference to the accompanying drawing wherein FIG. 1 shows diagrammatically a magnetic resonance imaging system in which the invention is used and FIGS. 2 and 3 show a diagrammatic representations of magnetic resonance acquisition sequences employed in the present invention.

The FIG. 1 shows diagrammatically a magnetic resonance imaging system in which the invention is used. The magnetic resonance imaging system includes a set of main coils 10 whereby the steady, uniform magnetic field is generated. The main coils are constructed, for example in such a manner that they enclose a tunnel-shaped examination space. The patient to be examined is placed on a patient carrier which is slid into this tunnel-shaped examination space. The magnetic resonance imaging system also includes a number of gradient coils 11, 12 whereby magnetic fields exhibiting spatial variations, notably in the form of temporary gradients in individual directions, are generated so as to be superposed on the uniform magnetic field. The gradient coils 11, 12 are connected to a controllable power supply unit 21. the gradient coils 11, 12 are energised by application of an electric current by means of the power supply unit 21; to this end the power supply unit is fitted with electronic gradient amplification circuit that applies the electric current to the gradient coils so as to generate gradient pulses (also termed 'gradient waveforms') of appropriate temporal shape The strength, direction and duration of the gradients are controlled by control of the power supply unit. The magnetic resonance imaging system also includes transmission and receiving coils 13, 16 for generating the RF excitation pulses and for picking up the magnetic resonance signals, respectively. The transmission coil 13 is preferably constructed as a body coil 13 whereby (a part of) the object to be examined can be enclosed. The body coil is usually arranged in the magnetic resonance imaging system in such a manner that the patient 30 to be examined is enclosed by the body coil 13 when he or she is arranged in the magnetic resonance imaging system. The body coil 13 acts as a transmission antenna for the transmission of the RF excitation pulses and RF refocusing pulses. Preferably, the body coil 13 involves a spatially uniform intensity distribution of the transmitted RF pulses (RFS). The same coil or antenna is usually used alternately as the transmission coil and the receiving coil. The inventions operates with either a dual/multi-tuned/tunable transmit coil array, or multiple independent transmit coils for the different RF frequency bands. Also note that the need for spatial uniformity is/may be less for 19F catheter tracking purposes.

Furthermore, the transmission and receiving coil is usually shaped as a coil, but other geometries where the transmission and receiving coil acts as a transmission and receiving antenna for RF electromagnetic signals are also feasible. The transmission and receiving coil 13 is connected to an electronic transmission and receiving circuit 15.

It is to be noted that it is alternatively possible to use separate receiving and/or transmission coils 16. For example, surface coils 16 can be used as receiving and/or transmission coils. Such surface coils have a high sensitivity in a comparatively small volume. The receiving coils, such as the surface coils, are connected to a demodulator 24 and the received magnetic resonance signals (MS) are demodulated by means of the demodulator 24. The demodulated magnetic resonance signals (DMS) are applied to a reconstruction unit. The receiving coil is connected to a preamplifier 23. The preamplifier 23 amplifies the RF resonance signal (MS) received by the receiving coil 16 and the amplified RF resonance signal is applied to a demodulator 24. The demodulator 24 demodulates the amplified RF resonance signal. The demodulated resonance signal contains the actual information concerning the local spin densities in the part of the object to be imaged. Furthermore, the transmission and receiving circuit 15 is connected to a modulator 22. The modulator 22 and the transmission and receiving circuit 15 activate the transmission coil 13 so as to transmit the RF excitation and refocusing pulses. The reconstruction unit derives one or more image signals from the demodulated magnetic resonance signals (DMS), which image signals represent the image information of the imaged part of the object to be examined. The reconstruction unit 25 in practice is constructed preferably as a digital image processing unit 25 which is programmed so as to derive from the demodulated magnetic resonance signals the image signals which represent the image information of the part of the object to be imaged. The signal on the output of the reconstruction monitor 26, so that the monitor can display the magnetic resonance image. It is alternatively possible to store the signal from the reconstruction unit 25 in a buffer unit 27 while awaiting further processing.

The magnetic resonance imaging system according to the invention is also provided with a control unit 20, for example in the form of a computer which includes a (micro)processor. The control unit 20 controls the execution of the RF excitations and the application of the temporary gradient fields. The control unit 20 controls the receiver system to acquire the acquisition segments of magnetic resonance signals in different RF-receiver frequency bands. The control unit 20 also controls the RF-excitation system to generate RF-excitations in different RF-excitation frequency bands. Further, the control unit is arranged to control the way the image information is displayed on the monitor 26. A video control unit 28 is provided to control the reconstruction unit and the monitor. The video control unit 28 controls the way the image signals that are produced by the reconstruction unit 25 are handled by the monitor 26. Information on how the images are to be formed and how to be displayed are provided by the control unit 20 to the video control unit 28. To this end, the computer program according to the invention is loaded, for example, into the control unit 20, the video control unit 28 and the reconstruction unit 25.

In general the receiver bandwidth ($\Delta\omega$), the applied magnetic gradient field strength (G) and the field-of-view (FOV) are related as for each type (i) of nucleus:

$$FOV^i = \frac{\Delta\omega^i}{\gamma^i G^i},$$

the receiver bandwidth is related to the sampling rate ($1/t_s$) as $$\Delta\omega = \frac{2\pi}{t_s}.$$

When simultaneous acquisition of the magnetic resonance signals from the different types of nuclei is done, then the magnetic field strength is equal then equal sized fields-of-view for the different types of nuclei can be achieved by adapting the receiver bandwidth of the respective types of nuclei (j,k) such that $$\frac{\Delta\omega^j}{\Delta\omega^k} = \frac{\gamma^j}{\gamma^k}.$$

In this mode of operation oversampling is invoked for the type(s) of nucleus having the larger gyromagnetic ratio. Alternatively, equal sampling rates can be employed for different types of nuclei at the expense of differences in the sizes of the field-of-view according to $$\frac{FOV^j}{FOV^k} = \frac{\gamma^j}{\gamma^k}.$$

The potential aliasing of the resulting image for the low-$\gamma$ nucleus is generally not problematic, since the location of the MR signal of the dedicated (non-proton) material is often confined to well-defined structures or locations. It is possible to show only the central part of the image overlayed on the anatomical roadmap, or display all the replicas that coincide with the larger FOV for the higher $\gamma$ nucleus. The user may select the replica of interest, and the system can then selectively display that replica.

FIGS. 2 and 3 show a diagrammatic representations of magnetic resonance acquisition sequences employed in the present invention. FIG. 2 shows two time traces. One time trace commences with a first RF-excitation RF1 at a RF-excitation frequency band followed by a temporary read gradient field G1. A next RF-excitation RF2 is applied at a different RF-excitation frequency band that is followed by another temporary read gradient field G2. For simplicity phase encoding gradient fields that are applied in practice are not shown in the drawings. During the respective read gradient fields G1 and G2 there are acquired respective acquisition segments of magnetic resonance signals MR1 and MR2. In the implementation shown in FIG. 3, the respective acquisition segments are acquired simultaneously. To this end the RF-excitations RF1, RF2 at respective RF-excitation bands are applied simultaneously, or within a short space of time. Acquisition of the acquisition segments of magnetic resonance signals MR1 and MR2 is done during application of the same read gradient field G.

In sequence optimisation, the mutual effects of the RF excitations RF1 and RF2 on the each other can be ignored, since the RF frequencies are well separated, and nucleus 1 is transparent for RF1 and vice versa. The only factor to account for is adequate echo formation and/or spoiling, since the gradient areas involved in the acquisition segment for nucleus 1 do affect the phase evolution of nucleus 2, and vice versa. This will be obvious for those knowledgeable in the field.

The invention claimed is:

1. A magnetic resonance imaging system comprising:
   a receiver system to acquire magnetic resonance signals;
   a reconstruction unit to reconstruct a magnetic resonance image from the acquired magnetic resonance signals; and
   a control system to control the receiver system to
      perform an acquisition sequence to acquire the magnetic resonance signals in several acquisition segments, wherein respective groups of acquisition segments involve acquisition of magnetic resonance signals in different RF-receiver frequency bands,
the control system is arranged to perform oversampling in the signal acquisition in lower RF-receiver frequency bands, and
the reconstruction unit is arranged to account for the oversampling.

2. The magnetic resonance imaging system as claimed in claim 1, wherein the acquisition sequence includes alternating or interleaved acquisition segments of different groups of acquisition segments.

3. The magnetic resonance imaging system as claimed in claim 1, wherein
the acquisition sequence includes simultaneous acquisition segments of different groups of acquisition segments,
the different RF-receiver frequency bands of these different groups of acquisition segments relating to different types of nuclei having different gyromagnetic ratios.

4. The magnetic resonance imaging system as claimed in claim 1, further comprising
an RF-excitation system,
the control system being further arranged to control the RF-excitation system, and
wherein
the acquisition sequence includes RF-excitations from several excitation groups,
respective excitation groups involve RF-excitations in different RF excitation frequency bands.

5. The magnetic resonance imaging system as claimed in claim 1, wherein at least one of the acquisition segments includes successive RF-excitations at pre-determined flip angles at alternating sign.

6. The magnetic resonance imaging system as claimed in claim 1, including
a gradient system to apply encoding magnetic gradient fields and
a correction module to correct for differences between the field-of-view at respective RF-receiver frequency bands.

7. The magnetic resonance imaging system as claimed in claim 4, wherein the control system is arranged to control the RF-excitation system to perform RF-excitation during acquisition of magnetic resonance echo signals at different RF-excitation frequency bands and RF-receiver frequency bands, respectively.

8. The magnetic resonance imaging system as claimed in claim 1, further including a display system to display magnetic resonance image reconstructed by the reconstruction unit,
the reconstruction unit being arranged to reconstruct respective magnetic resonance images from magnetic resonance signals from respective acquired groups of segments, and
the display system being arranged to successively display the respective magnetic resonance image at a frame rate of at least a threshold frame rate.

9. The magnetic resonance imaging system as claimed in claim 8, wherein the reconstruction unit is arranged to reconstruct a merged magnetic resonance image from magnetic resonance signals from several acquired groups of segments or from respective magnetic resonance images from magnetic resonance signals from respective acquired groups of segments.

10. The magnetic resonance imaging system as claimed in claim 8, wherein the display system is arranged to display image information from respective RF-receiver frequency bands is different ways, including in different colors.

11. A magnetic resonance imaging method comprising the acts of:
performing an acquisition sequence to acquire magnetic resonance signals in several acquisition segments, wherein respective groups of acquisition segments involve acquisition of magnetic resonance signals in different RF-receiver frequency bands, and wherein the performing act includes oversampling the magnetic resonance signals in lower RF-receiver frequency bands; and
accounting for the oversampling act.

12. A computer readable medium embodying a computer program, the computer program when executed by a processor is configured to perform an acquisition sequence to acquire magnetic resonance signals in several acquisition segments respective groups of acquisition segments involve acquisition of magnetic resonance signals in different RF-receiver frequency bands, including oversampling the magnetic resonance signals in lower RF-receiver frequency bands; and to account for the oversampling.

* * * * *